United States Patent
Chang et al.

(10) Patent No.: US 6,980,135 B2
(45) Date of Patent: Dec. 27, 2005

(54) LOGIC CIRCUIT USING HARDWARE TO PROCESS KEYBOARD SCANNING

(75) Inventors: Chi-Tung Chang, Taipei Hsien (TW); Don Chang, Taipei (TW)

(73) Assignee: Alcor Micro, Corp., Taipei (TW)

( * ) Notice: Subject to any disclaimer, the term of this patent is extended or adjusted under 35 U.S.C. 154(b) by 367 days.

(21) Appl. No.: 10/042,331

(22) Filed: Jan. 11, 2002

(65) Prior Publication Data

US 2003/0132864 A1  Jul. 17, 2003

(51) Int. Cl.$^7$ ............................................. H03M 11/00
(52) U.S. Cl. ......................... 341/26; 341/20; 341/14.1; 345/168
(58) Field of Search .................. 341/20, 26; 340/14.1; 345/168

(56) References Cited

U.S. PATENT DOCUMENTS

| | | | | |
|---|---|---|---|---|
| 4,583,189 A | * | 4/1986 | Koyama | 708/142 |
| 5,057,836 A | * | 10/1991 | Inaba | 341/26 |
| 5,381,142 A | * | 1/1995 | Simmons, Jr. | 341/26 |
| 5,619,196 A | * | 4/1997 | Escobosa | 341/22 |
| 5,719,597 A | * | 2/1998 | Fong | 345/174 |
| 5,760,714 A | * | 6/1998 | Zimmerman | 341/26 |
| 5,798,716 A | * | 8/1998 | Davis | 341/26 |
| 5,872,561 A | * | 2/1999 | Figie et al. | 345/168 |
| 5,877,709 A | * | 3/1999 | Ala-Lehtimaki et al. | 341/26 |
| 5,929,790 A | * | 7/1999 | Lim | 341/22 |
| 6,020,833 A | * | 2/2000 | Chang et al. | 341/26 |
| 6,737,990 B1 | * | 5/2004 | Chau | 341/22 |
| 6,762,697 B2 | * | 7/2004 | Lin | 341/26 |

* cited by examiner

Primary Examiner—Albert K. Wong
(74) Attorney, Agent, or Firm—Troxell Law Office, PLLC (57) ABSTRACT

A logic circuit uses hardware to process keyboard scanning, more especially, a microprocessing system inputs the signal through a pressed key into a control circuit for conducting operation; since the column input end has electric resistance with higher driving ability than that of the row output/input end, a higher electric potential status is thereby obtained and conducted with the circuit through a pressed key to make the high and the lower electric potentials approach in accordance with each other and generate electric potential change, or through a converting method of automatically driving electric potential, the innovative effect of the present invention is achieved.

1 Claim, 8 Drawing Sheets

LOGIC CIRCUIT USING HARDWARE TO PROCESS KEYBOARD SCANNING

BACKGROUND OF THE INVENTION

1) Field of the Invention

The present invention relates to a logic circuit using hardware to process keyboard scanning, more especially to a microprocessing system applied to a computer, a mobile phone, an electronic dictionary and calculator using a pressed key to input the signal into a control circuit for conducting operation for an efficient detecting method of recognizing the locations and numbers of pressed keys.

2) Description of the Prior Art

The common and familiar method of keyboard recognition mainly has a diode disposed between an input and an output ports; the unidirectional current conduction of the diode detects whether a current is passing by for recognizing a valid signal of a presses key.

However, the abovementioned method for detecting whether there is a pressed key signal has to be added with one to a plurality of current conducting diode and that complicates the circuit detection; furthermore, the increased components also increase unnecessary power consumption; the degree of wearing of the microprocessing system in a computer, a mobile phone, an electronic dictionary and calculator using a pressed key to input the signal into a control circuit for conducting operation will also be increased.

SUMMARY OF THE INVENTION

Therefore, the objective of the present invention is to save cost and be capable of reducing power consumption, which does not inconvenience the application due to the augmented function of reducing power consumption, but increases and enhances the consistent operation of a computer, a mobile phone, an electronic dictionary and calculator due to the unique method of the present invention, thereby eliminates the shortcomings of being inconvenient for an user to use and increases the practicality and convenience thereof.

To enable a further understanding of the method, the procedure, the spirit and the other objectives of the present invention, the brief description of the drawings below is followed by the detailed description of the preferred embodiment.

DETAILED DESCRIPTION OF THE PREFERRED EMBODIMENTS

Figure 1:
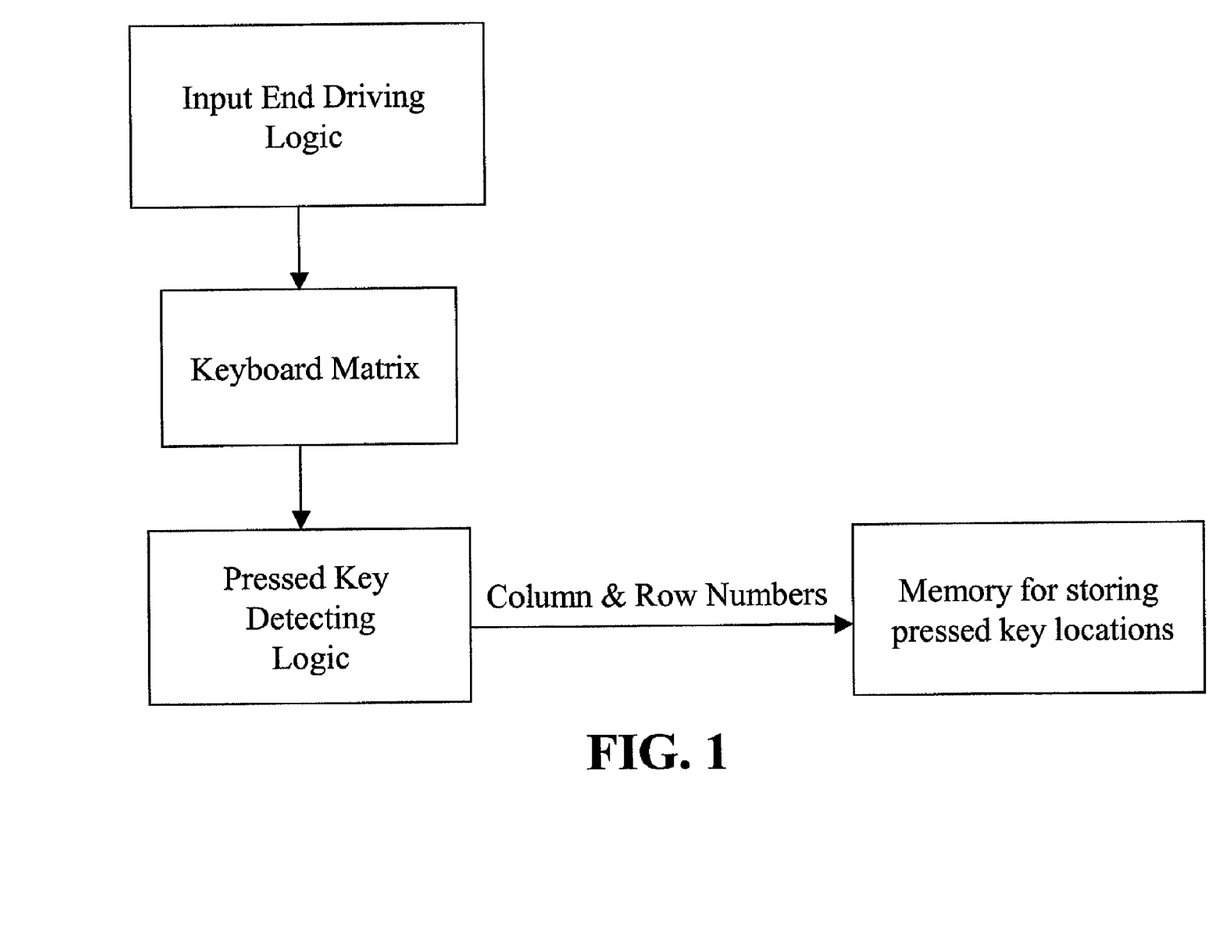
FIG. 1 is an operating flow chart of the present invention.
Figures 2A, 2B:
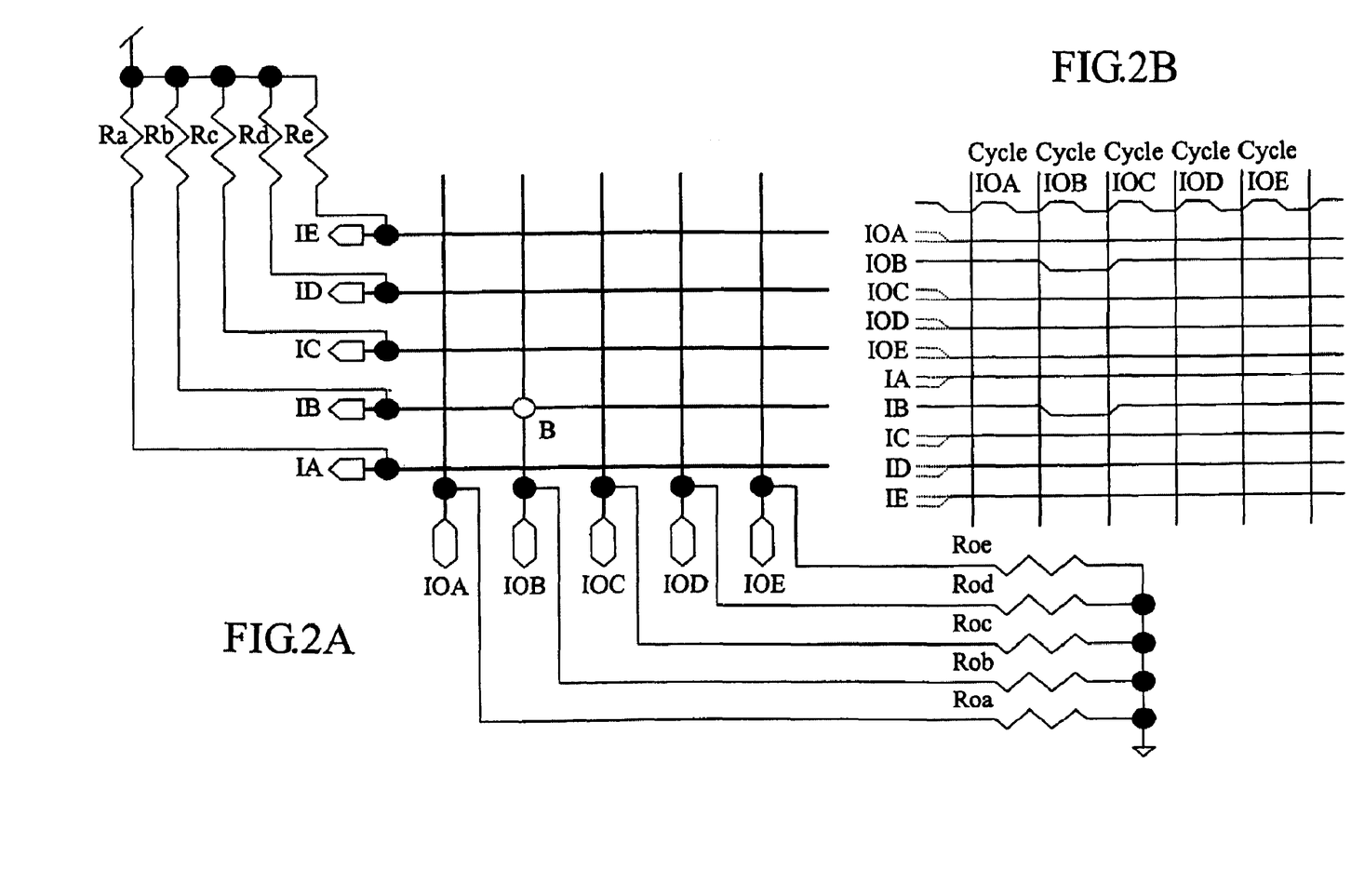
FIGS. 2A and 2B are drawings of the logic circuit and oscillogram of the present invention.

Referring to FIGS. 1 and 2, mainly, the present invention of a logic circuit using hardware to process keyboard scanning utilizes the driving ability of electric resistances (Ra to Re) of column input ends (IA to IE) higher than that connected to electric resistances (Roa to Roe) of row output/input ends (IOA to IOE) to accordingly dispose the column input ends (IA to IE) formed naturally at the higher electrical potential status and the row output/input ends (IOA to IOE); when the key located at the crossing point of the column input end and the row output/input end is pressed, the current of the said column input end and the row output/input end conduct with each other for changing the high and lower electrical potential status to approach to a consistent and equal electric potential.

When one or a plurality of specially appointed keys are pressed to generate output/input end driving logic, the electrical potentials are conducted with each other; after conduction, one of the row output/input ends (IOA to IOE) should convert from a low electric potential status to a high electric potential status; when a keyboard matrix detects that any one or more than one signal of the row output/input ends (IOA to IOE) convert from a lower electric potential status to a higher electric potential status, that means a key is pressed.

A pressed key detecting logic alternately detects that whether one of the row output/input ends (IOA to IOE) with elevated electric potential changes to a low electric potential status; since the pressed key conducts the electrical potential between the said column and row to an equal state, when one or more than one of the column input ends (IA to IE) converts from a high electric potential to a low electric state, the location of the pressed key can be detected through the crossing point of the said matrix; then the pressed key detecting logic informs an external logic to store this one or a plurality of column and row numbers in a memory for storing pressed key locations.

After the external logic stores the column and row numbers in the memory for storing pressed key locations, the pressed key detecting logic waits for a period of time of unstable signals and then inputs the signals; it is required that only if the same result is obtained after two detections, then the pressed key is listed as a valid one and a report is output to the system for execution.

Furthermore, no matter whether a key is pressed or not, the pressed key detecting logic can always sequentially and alternately drive one of the row output/input ends (IOA to IOE) to a low electric potential status; when one of the row output/input ends (IOA to IOE) is driven to a low electric potential status and the pressed key logic detects that all of the column input ends (IA to IE) are in a high electric potential status, that means this column does not have any pressed key, then the pressed key detecting logic moves to drive the next row output/input signal.

When one of the row output/input ends (IOA to IOE) is driven to a low electric potential status and the pressed key detecting logic detects any one or more than one of the column input ends (IA to IE) is in a low electric status, it informs the external logic to store this one or a plurality of column and row numbers in the memory for storing pressed key locations.

After the external logic stores the column and row numbers in the memory for storing pressed key locations, the pressed key detecting logic waits for a period of time of unstable signals and then inputs the signals; it is required that only if the same result is obtained after two detections, then the pressed key is listed as a valid one and a report is output to the system for execution.

Figures 3A, 3B:
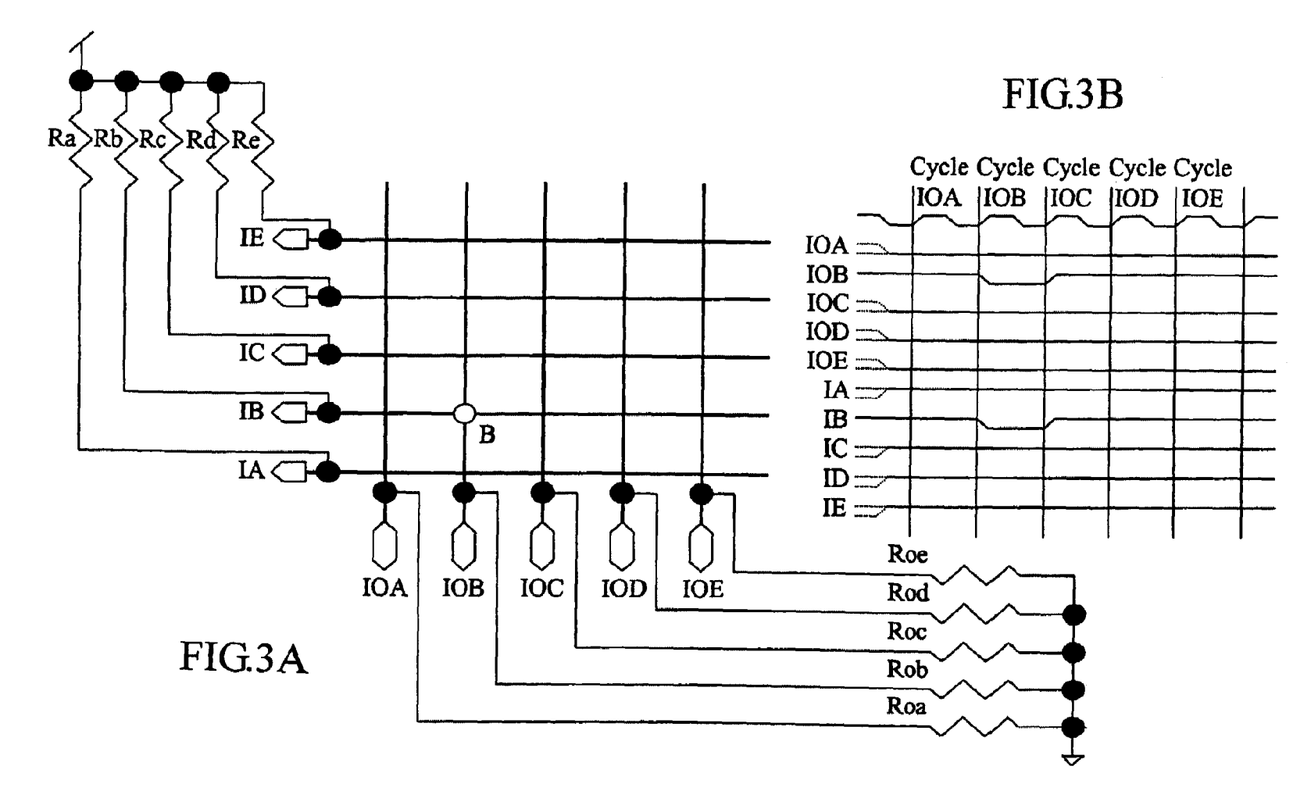
FIGS. 3A and 3B are drawings of the logic circuit and the oscillogram of the first exemplary embodiment of the present invention.

Referring from FIG. 3 to FIG. 8, the exemplary embodiment of the present invention using hardware to process keyboard scanning, the first example (as shown in FIG. 3) indicates that when key B is pressed, (IOB) is then driven to a high electric status because of the electric potential conduction; when the pressed key detecting logic drives the row (IOB) to a low electric potential status, the column (IB) is also driven to a low electric potential; therefore, the pressed key detecting logic determines that the column and row location of key B is IOB and IB; it also stores this data in the memory for storing pressed key locations.

Figures 4A, 4B:
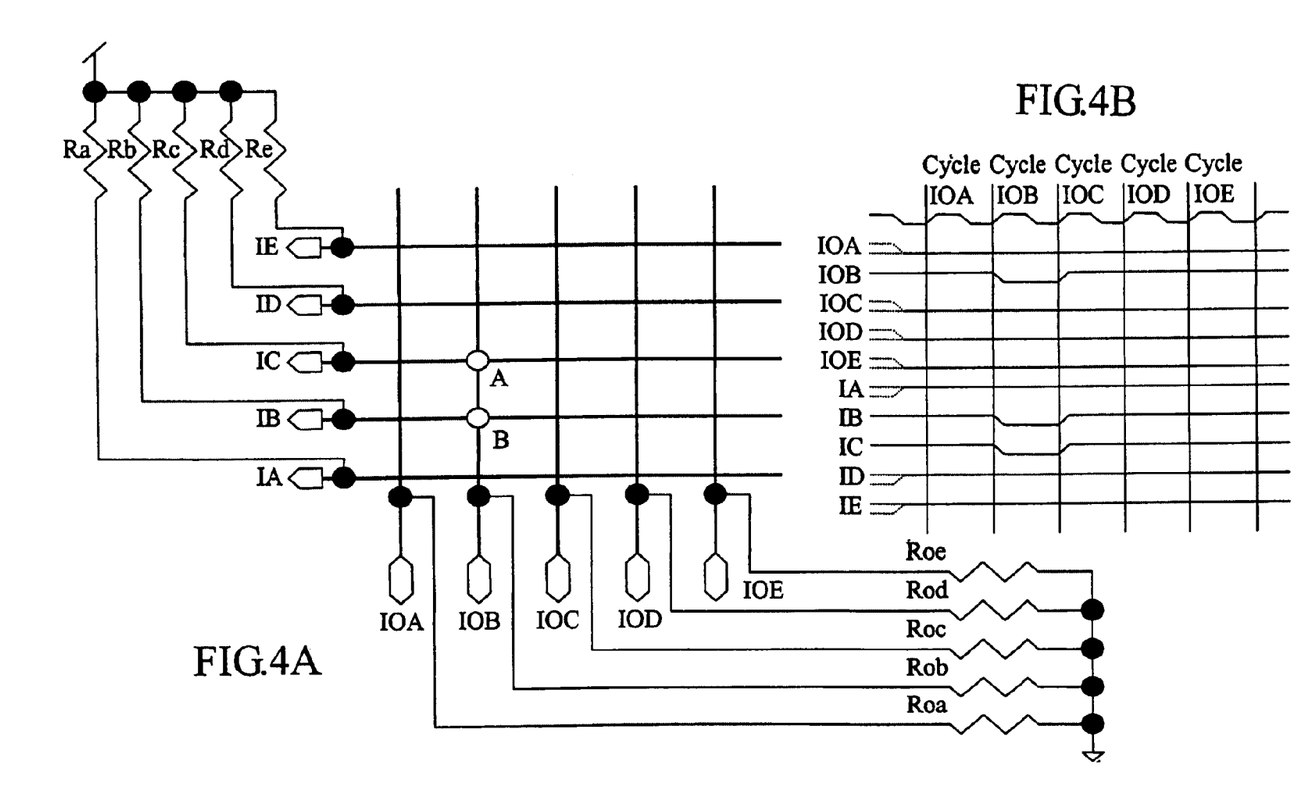
FIGS. 4A and 4B are drawings of the logic circuit and the oscillogram of the second exemplary embodiment of the present invention.

The second example (as shown in FIG. 4), when keys B and A are pressed synchronously, the row (IOB) is driven to a high electrical potential status; when the pressed key detecting logic drives the row (IOB) to a low electric potential status, the column (IB) and the column (IC) are also driven to a low electric potential; therefore, the pressed key detecting logic determines that both of the keys B and A are pressed and the column and row location thereof is (IOB) and (IB) as well as (IOB) and (IC), it also stores this data in the memory for storing pressed key locations.

Figures 5A, 5B:
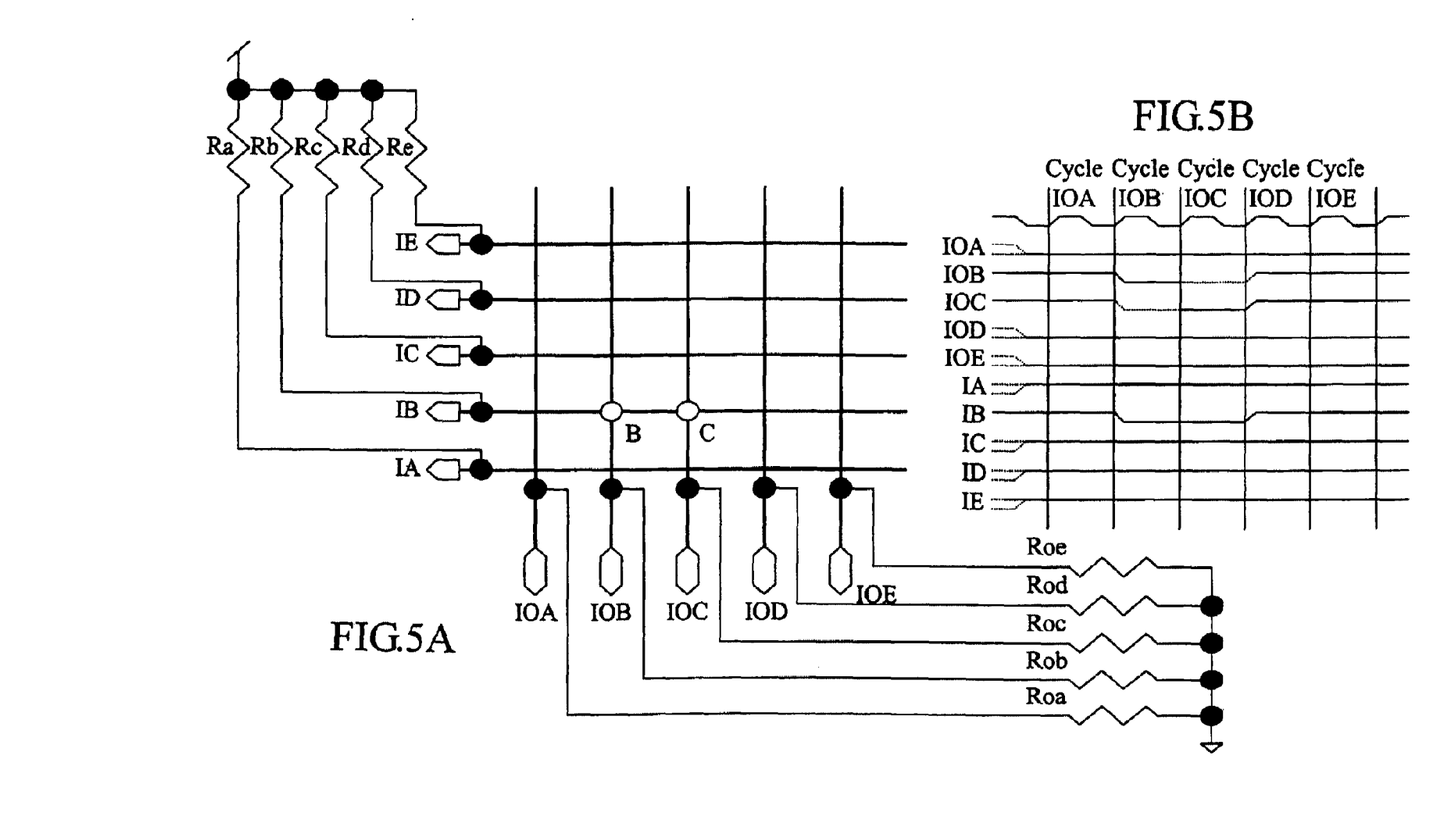
FIGS. 5A and 5B are drawings of the logic circuit and the oscillogram of the third exemplary embodiment of the present invention.
Figures 7A, 7B:
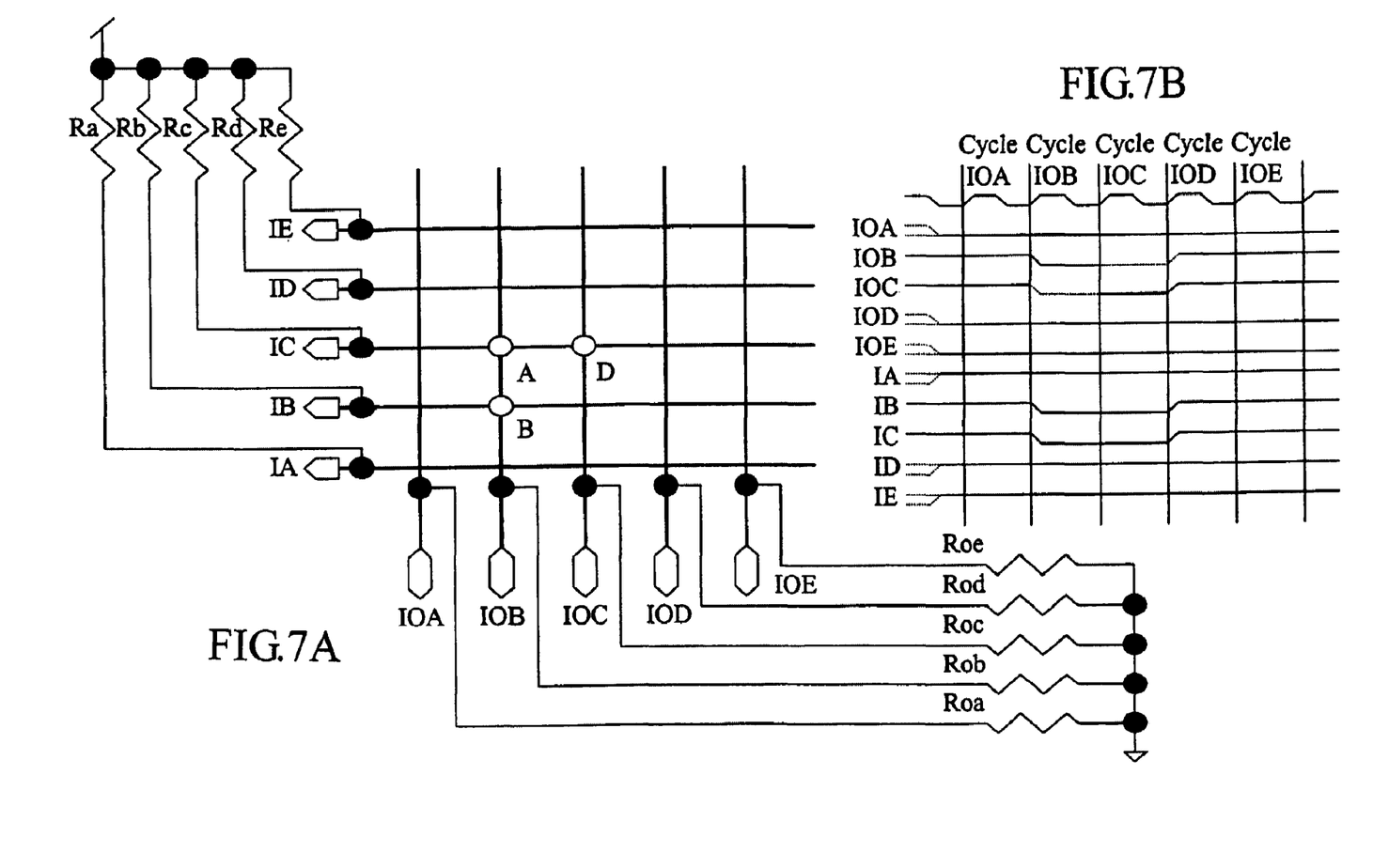
FIGS. 7A and 7B are drawings of the logic circuit and the oscillogram of the fifth exemplary embodiment of the present invention.
Figures 8A, 8B:
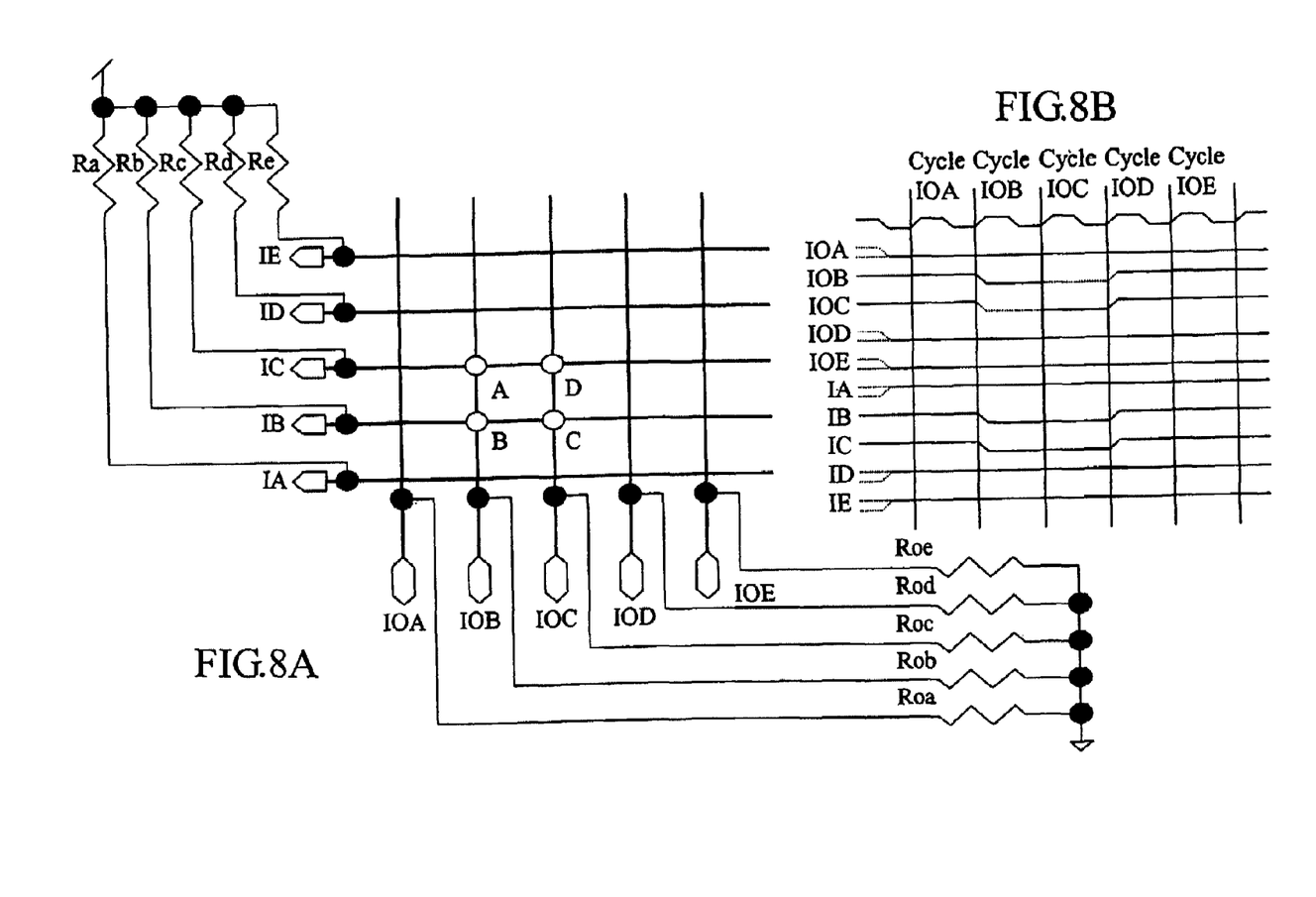
FIGS. 8A and 8B are drawings of the logic circuit and the oscillogram of the sixth exemplary embodiment of the present invention.

The third example (as shown in FIG. 5), when key B and C are pressed at the same time, the rows (IOB) and (IOC) are driven to a high electric potential status; when the pressed key detecting logic drives the row (IOB) to a low electric potential status, column (IB) is driven to a low electric potential status, however, at the same time, the column (IOC) is also driven to a low electric potential status; this influence will be discussed in the fifth (as shown in FIG. 7) and the sixth (as shown in FIG. 8) examples; in this example, the data about the row (IOC) is also driven to a low electric potential status can be ignored; therefore, the pressed key detecting logic determines that key B is pressed and the column and row location thereof is (IOB) and (IB) to be stored in the memory for storing pressed key locations; sequentially, when the pressed key detecting logic drives the row (IOB) to a high electric potential status and the row (IOC) to a low electric potential status, the column (IB) is driven to a low electric potential status, however, the row (IOB) is also driven to a low electric potential status; as the same, the pressed key detecting logic determines that key C is pressed and the column and row location thereof is (IOC) and (IB) to be stored in the memory for storing pressed key locations.

Figures 6A, 6B:
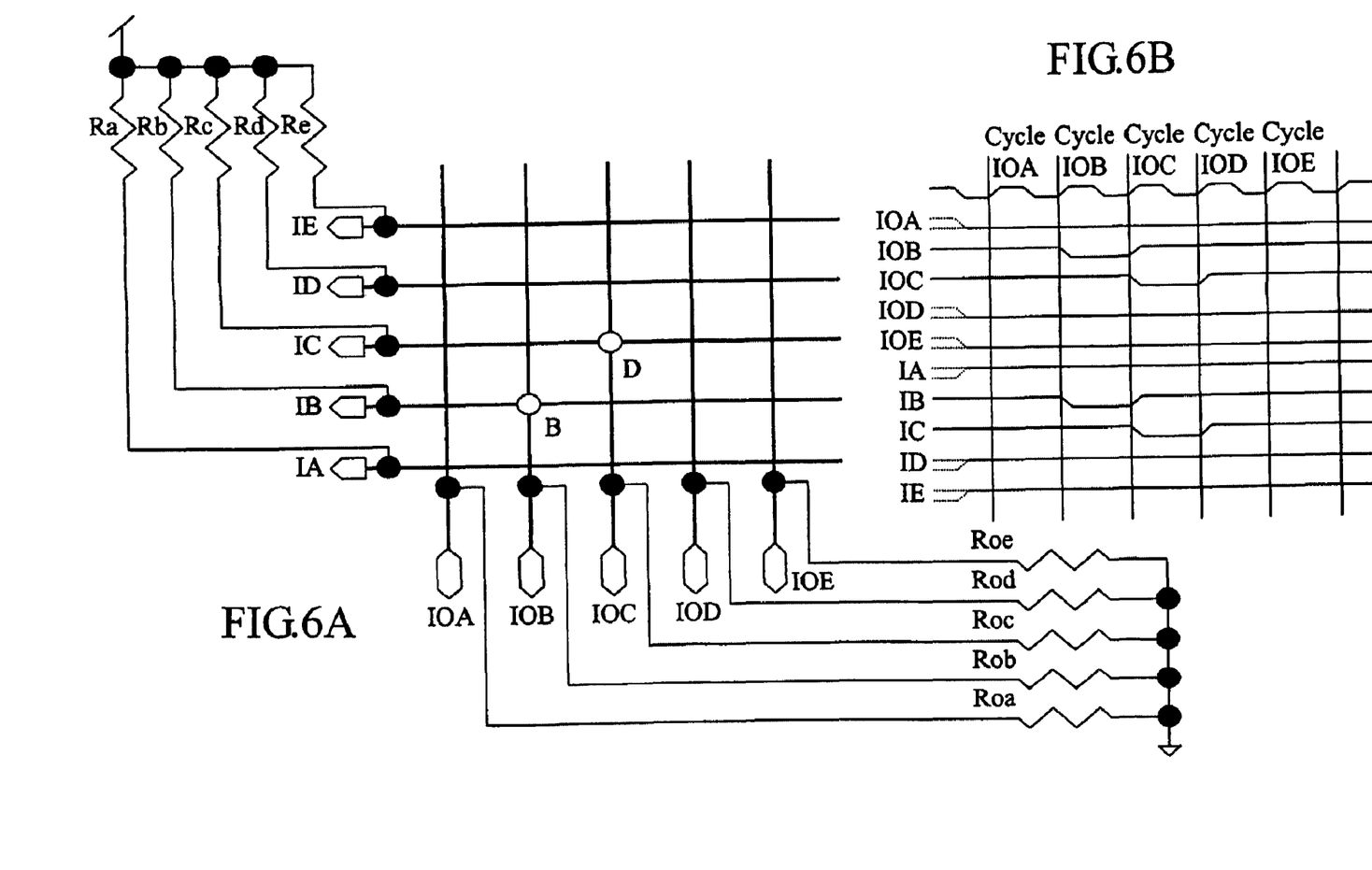
FIGS. 6A and 6B are drawings of the logic circuit and the oscillogram of the fourth exemplary embodiment of the present invention.

The fourth example (as shown in FIG. 6), when keys B and D are pressed synchronously, the rows (IOB) and (IOC) are driven to a high electric potential status; when the pressed key detecting logic drives the row (IOB) to a low electric potential status, the column (IB) is driven to a low electric potential status; therefore, the pressed key detecting logic determines that key B is pressed and the column and row location thereof is (IOB) and (IB) to be stored in the memory for storing pressed key locations; sequentially, when the pressed key detecting logic drives the row (IOB) to a high electric potential status and the row (IOC) to a low electric potential status, the column (IC) is driven to a low electric potential status; therefore, the pressed key detecting logic determines that key D is pressed and the column and row location thereof is (IOC) and (IC) to be stored in the memory for storing pressed key locations.

The fifth example (as shown in FIG. 7), when keys A, B and D are pressed synchronously, the rows (IOB) and (IOC) are driven to a high electric potential status; when the pressed key detecting logic drives the row (IOB) to a low electric potential status, the column (IB) and column (IC) are driven to a low electric potential status; however, at the same time, the row (IOC) is also driven to a low electric potential status; therefore, the key C is defined as an uncertain key.

Referring to FIG. 8 for the sixth example, when keys A, B, C and D are pressed synchronously, the same situation will happen; however, the pressed key detecting logic can use the following two conditions to detect the existence of an uncertain key:

1. When more than one electric potential of the row output/input ends (IOA to IOE) are in a low electric potential status (including the row output/input terminals driven by the pressed key detecting logic).
2. When more than one electric potential of the column input ends (IA to IE) is in a low electric potential status.

The abovementioned two conditions must exist at the same time to thereby determine that the state of having an uncertain key exists.

In summation of the abovementioned, the present invention provides a logic circuit useing hardware to process keyboard scanning for detecting and recognizing a pressed key; the present invention not only eliminates the shortcomings of the prior art of detecting by means of complicate and expensive components, but also possesses the effect of lowest power consumption; it is based on innovative ideas and spirit; furthermore, it has not been preceded in any previous patent application and is not available on the market.

It is of course to be understood that the embodiment described herein is merely illustrative of the principles of the invention and that a wide variety of modifications thereto may be effected by persons skilled in the art without departing from the spirit and scope of the invention as set forth in the following claims.

What is claimed is:

1. A system for detecting and storing pressed key location data for a keyboard, the system comprising:
    a) a keyboard matrix having an electrical array including a plurality of electrical conductors arranged in orthogonal row and columns with a plurality of intersections, the conductors in the rows normally being out of electronic contact with the conductors in the columns, the electrical conductors in the columns normally having a higher electrical potential than the electrical conductors in the rows;
    b) an electrical resistance connected with each of the plurality of electrical conductors in the columns; and
    c) pressed key detecting logic connected to the keyboard matrix such that, when a key on the keyboard is pressed, one of electrical conductors in a row is brought into electrical contact with one of the electrical conductors in a column causing the electrical conductor in the column to have the higher electrical potential that is detected by the pressed key detecting logic to determine the column location of the pressed key, the pressed key detecting logic then changing the electrical potential of the electrical conductor in the column to a lower electrical potential causing the electrical conductor in the row to have the lower electrical potential which is detected by the pressed key detecting logic to determine the row location of the pressed key.

* * * * *